United States Patent [19]
Hanabusa et al.

[11] 3,884,771
[45] May 20, 1975

[54] PROCESS OF PRODUCING RESINOUS BOARD HAVING A ROUGH SURFACE USABLE FOR FIRMLY SUPPORTING THEREON A PRINTED CIRCUIT

[75] Inventors: Takayoshi Hanabusa, Kawasaki; Hiroshi Isozuka, Yokohama; Kunioki Miyao, Tokyo; Morio Gaku, Sagamihara, all of Japan

[73] Assignee: Fujitsu Limited, Kanagawa, Japan

[22] Filed: June 21, 1973

[21] Appl. No.: 371,995

[30] Foreign Application Priority Data

June 29, 1972 Japan ................................ 47-65172

[52] U.S. Cl. .................. 204/12; 156/581; 156/220; 204/27; 264/220; 264/293

[51] Int. Cl. .......................... C23b 7/02; C23b 5/58

[58] Field of Search ............ 156/220, 581; 100/595, 100/597; 204/6, 24, 27, 23, 12; 264/293, 284, 219, 220; 101/16, 28–31

[56] References Cited

UNITED STATES PATENTS

| | | | |
|---|---|---|---|
| 2,679,473 | 5/1954 | Swartz | 204/6 |
| 3,012,285 | 12/1961 | Marcus et al. | 264/293 |
| 3,584,110 | 6/1971 | Blaszkow | 264/293 |
| 3,761,338 | 9/1973 | Ungar et al. | 156/220 |

*Primary Examiner*—T. M. Tufariello
*Attorney, Agent, or Firm*—Maleson, Kimmelman and Ratner

[57] ABSTRACT

A resinous board having a rough surface usable for firmly supporting a printed circuit thereon is produced by such a process that one or more prepreg is superimposed on a rough surface of a metal layer plated on a base material, and pressed and heated so as to convert them into one body of a resinous board and transfer the rough surface pattern of the plated metal layer onto the surface of the resinous board, and the base material and at least a part of the plated metal layer are removed from the resinous board.

20 Claims, 8 Drawing Figures

PROCESS OF PRODUCING RESINOUS BOARD HAVING A ROUGH SURFACE USABLE FOR FIRMLY SUPPORTING THEREON A PRINTED CIRCUIT

The present invention relates to a process of producing a resinous board having a rough surface, particularly, relates to a process of producing a rigid resinous board having a rough surface pertinent for supporting printed circuit thereon.

Printed circuit boards including single face printed circuit boards, double face printed circuit boards, through hole printed circuit boards, flexible printed circuit boards and multilayer printed circuit boards, are utilized in a wide various fields. Such printed circuit boards are generally prepared from insulating resinous board coated with a copper foil. The conventional copper coated resinous board has the following disadvantages.

1. The resinous board is limited to one having a high adhesiveness to the copper foil. Low adhesive resinous board cannot be utilized, because of a large tendency of the printed circuit to peel off the resinous board.

2. The copper foil to be coaded on the resinous board is limited in thickness to not smaller than 18 $\mu$. The copper foil having a thickness smaller than 18 $\mu$ cannot be utilized, because such thin foil has many pin holes and is difficult to use in the processing or manufacture of printed circuit.

3. The copper foil having a thickness of larger than 18 $\mu$ has a limitation in the precision of the patterned circuit produced by way of photoetching. Accordingly, such copper foil is not suitable for producing an accurate fine circuit therefrom.

4. The copper foil is expensive.

5. The process of producing the printed circuit board from the copper coated resinous board is complicated. Therefore, this results in high cost.

In order to eliminate the above-stated disadvantages of the conventional copper coated resinous board, various attempts have previously been made to produce the printed circuit board using no copper foil. For example, an electroless (non-electrolytic) plating method is applied to the formation of the printed circuit. In such method, an electroless copper plating bath is reduced so as to selectively deposit reduced copper onto a surface of the resinous board in accordance with a desired pattern. For such selective deposition, reducing metal powder, for example, palladium, copper, silver, nickel and platinum powders are mixed with the resin to be formed into the resinous board, dispersed onto the surface of a half-dried resinous board, or screen-printed on the surface of the resinous board. The above-stated methods of forming the printed circuit have the following disadvantages.

1. During the electroless plating, copper deposits non-uniformly.

2. There is a difficulty in the formation of a precise printed circuit.

3. There is a technical difficulty in the connection of the printed circuit to a conductive intermediate layer of the printed circuit board, on the inside wall surface of a hole formed through the board.

4. The reduced copper tends to deposit about the reducing metal particles distributed on the surface of the resinous board. Such deposition of copper results in formation of a rough surface copper layer. Accordingly, an especially careful plating operation is required to obtain a smooth surface copper layer plated on the resinous board.

5. The non-uniform deposition of copper may result in an undesirable change in the surface property or electrical properties of the resinous board.

6. The printed circuit layer is easily peeled off from the resinous board because of the smoothness of the conventional resinous board.

The object of the present invention is to provide a process of producing resinous board having a rough surface effective for supporting printed circuits thereon, both under normal and elevated temperature conditions.

Another object of the present invention is to provide a process of producing resinous board having a rough surface capable of forming thereon a printed circuit having a high resistance against peeling off, by way of an electroless plating method without the use of copper foil.

A further object of the present invention is to provide a process of producing a resinous board having a rough surface, at a low cost.

According to the present invention, the resinous board having a rough effective surface is produced by providing a plated rough surface metal layer on a base material, superimposing at least one prepreg consisting of at least one insulating fibrous substrate impregnated with an insulating half-dried resin liquid, on the rough surface of the base material, pressing and heating the superimposed prepreg and the base material to convert the prepreg into a resinous board, and removing the base material and at least a part of the plated rough surface metal layer from the resinous board. By the above process, a rough surface pattern of the plated rough surface metal layer is transferred onto the surface of the resinous board.

The resinous board of the present invention has a rough surface provided with numerous small convexities and concavities of a height and depth of about 1 to 5 $\mu$. Such rough surface has a large contacting area to the plated metal layer and is therefore, effective for enhancing the firm fixing of the plated metal layer to the resinous board. Accordingly, the resinous board of the present invention is useful for the production of the printed circuit board.

The base material usable for the process of the present invention may consist of a substance capable of being plated, such as metals and thermoplastic synthetic polymers, and may be shaped in plate, foil film and other desired forms. The base metal may be selected from aluminium, nickel, steel, and alloys containing one or more of the above-stated metals. The base thermoplastic synthetic polymer may be selected from polyethylene terephthalate, and cellulose acetate. It is necessary that after the resinous board is formed, the base material can be easily removed from the resinous board by way of dissolving with acid or alkali solution or peeling off.

The metal base material preferably has a thickness of 20 to 100 $\mu$, more preferably, 40 to 60 $\mu$. Generally, the plated rough surface layer is firmly fixed to the metallic base material. Accordingly, it is difficult to peel off the metallic base material from the plated rough surface layer bonded with the resinous board. Therefore, the metallic base material is usually removed by way of etching. If the metallic base material has a thickness larger than 100 μ, the removal requires a very long time. This results in an economical disadvantage. If the thickness of the metallic base material is smaller than 20 μ, the metallic base material is difficult to handle and process.

The metal to be plated onto the base material may be selected from lead, tin, zinc, copper, nickel, cobalt and alloys of the above-mentioned metals. These metals are relatively cheap and easily removable from the resinous board by way of dissolving away with acid or alkali solution.

In the normal plating process, it is necessary that the plated metal layer is composed of very fine metal crystals in order for the layer to have a uniform smooth surface without pin hole. On the other hand, in the process of the present invention, it is important that the plated metal layer is composed of large crystals so that it has an uneven rough surface and pin holes. Accordingly, in the process of the present invention it is not necessary to use a special additive for enhancing uniformity or luster of the plated metal layer. Therefore, the plating step in the process of the present invention is performed using a relatively simple plating bath containing, for example, $Sn(BF_4)_2$, $Pb(BF_4)_2$, $K_2SnO_2$, $ZnSO_4$, $ZnO$, $Zn_2P_2O_7$, $SnCl_2$, $ZnCl_2$, $Zn(CN)_2$ and $SnSO_4$.

For example, the plated rough surface metal layer may be formed by an electrolytic plating method using any one of the plating baths detailed below.

| | | |
|---|---|---|
| 1 | Pb-Sn plating bath | |
| | Composition | |
| | 45% $Sn(BF_4)_2$ aqueous solution | 185 g/l |
| | $Pb(BF_4)_2$ | 81 g/l |
| | 42% $HBF_4$ aqueous solution | 270 – 100 g/l |
| | $H_3BO_3$ | 15 – 20 g/l |
| | Temperature of bath | 20 – 50 °C |
| | Current density | 2 – 30 A/dm² |
| 2 | Sn plating bath | |
| | Composition | |
| | $K_2SnO_2$ | 90 – 150 g/l |
| | kOH | 10 – 20 g/l |
| | Temperature of bath | 60 – 90 °C |
| | Current density | 1 – 10 A/dm² |
| 3 | Zn plating bath | |
| | Composition | |
| | $ZnSO_4$ | 150 g/l |
| | $NH_4Cl$ | 40 g/l |
| | $CH_3COONa.3H_2O$ | 30 g/l |
| | Temperature of bath | room temp. |
| | Current density | 5 – 15 A/dm² |

Also, the plating may be effected by the conventional electroless plating methods.

The plated rough surface metal layer preferably has a thickness as small as possible so long as the convexities or concavities formed in the plated metal layer have a height or depth of 1 to 5 μ. The small thickness of the plated metal layer can be easily removed by etching from the resinous board. The 1 to 5 μ height and depth of the convexities and concavities are effective for forming the desired rough surface on the resinous board.

The plated Pb-Sn, Sn and Zn layers may be removed by treating, for example, with an aqueous solution containing 5 g/l of sodium peroxide and 200 g/l of sodium hydroxide at a temperature of about 50°C for about 2 minutes. Also, the plated zinc layer may be removed with 15 percent aqueous solution of hydrochloric acid.

The prepreg usable for the process of the present invention is composed of at least one insulating fibrous substrate impregnated with a half-dried insulating synthetic resin liquid. The fibrous substrate may be selected from the group consisting of glass and synthetic fiber webs and fabrics and paper.

The insulating resin usable for the prepreg may be selected from the group consisting of unsaturated polyesters, polyimides, epoxy resins, phenolilc resins and polybisdiens.

A thin flexible resinous board may be prepared from one prepreg. A thick rigid resinous board may be prepared from two or more prepregs superimposed.

According to the process of the present invention, one or more prepreg is superimposed on the rough surface metal layer plated on the base material, and the superimposed prepreg and base material are pressed and heated so as to convert the prepreg to a resinous boaord and simultaneously transfer the rough surface pattern of the plated rough surface metal layer to the surface of the resinous board. The pressing is preferably carried out under a pressure of 5–80 kg/cm², and the heating is preferably effected at a temperature of 130°–250°C. The pressure and temperature depend on the kind of the fibrous substrate and resin used for the prepreg.

The features and advantages of the present invention will be apparent upon reading the following description and inspecting the accompanying drawings, in which.

Figure 1:
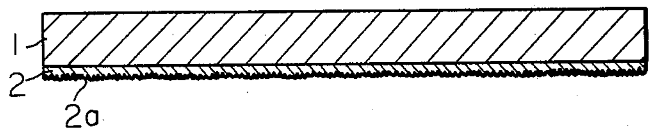
FIG. 1 is a cross-sectional schematic view of a pressing plate provided with a plated rough surface metal layer.

Referring to FIG. 1, a pressing plate 1 consisting of stainless steel or nickel silver is plated with a porous metal layer 2 having a rough surface 2*a*.

Figure 2:
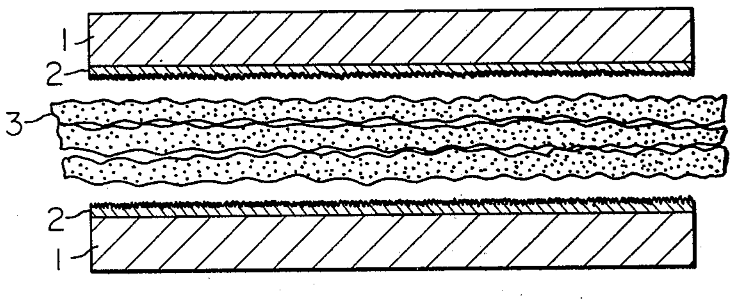
FIG. 2 is a cross-sectional schematic view of a pair of pressing plates each having a plated rough surface metal layer and three prepregs inserted between the pressing plates.

Referring to FIG. 2, three prepregs 3 are inserted between a pair of pressing plates 1 facing each other and each having a rough surface metal layer 2.

Figure 3:
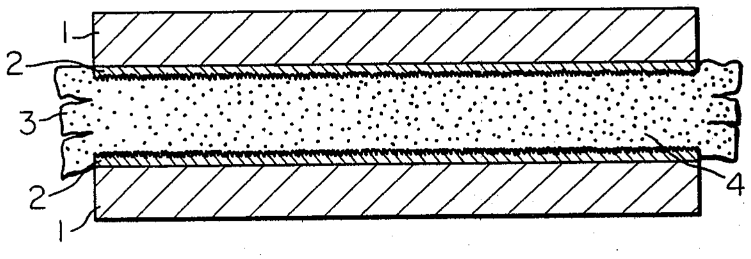
FIG. 3 is a cross-sectional schematic view of three prepregs pressed by a pair of pressing plates each having a plated rough surface metal layer.

Referring to FIG. 3, the prepregs 3 are pressed and heated between the pressing plates 1, and incorporated into one board 4.

After completing the pressing and the heating, the pressing plates 1 are removed from the board 4.

When the bonding force of the metal layer 2 to the pressing plate 1 is larger than that of the metal layer 2 to the resinous board 4, the metal layers 2 together with the pressing plates 1, are removed from the resinous board 4. However, if the bonding force of the metal layer 2 to the pressing plate 1 is smaller than that to the resinous board 4, the metal layer 2 is left on the resinous board 4 after removing the pressing plates 1. When the metal layer 2 is left on the resinous board 4 the metal layer 2 is removed by dissolving it away with an acid or alkali solution.

Figure 4:
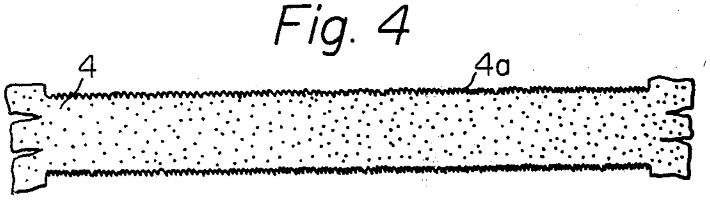
FIG. 4 is a cross-sectional schematic view of a resinous board having rough surfaces.

FIG. 4 shows a resinous board 4 having upper and lower rough surfaces 4*a* which have been transferred from the rough surface 2*a* of the metal layer 2 as shown in FIGS. 1 through 3.

Figures 5, 6, 7, 8:
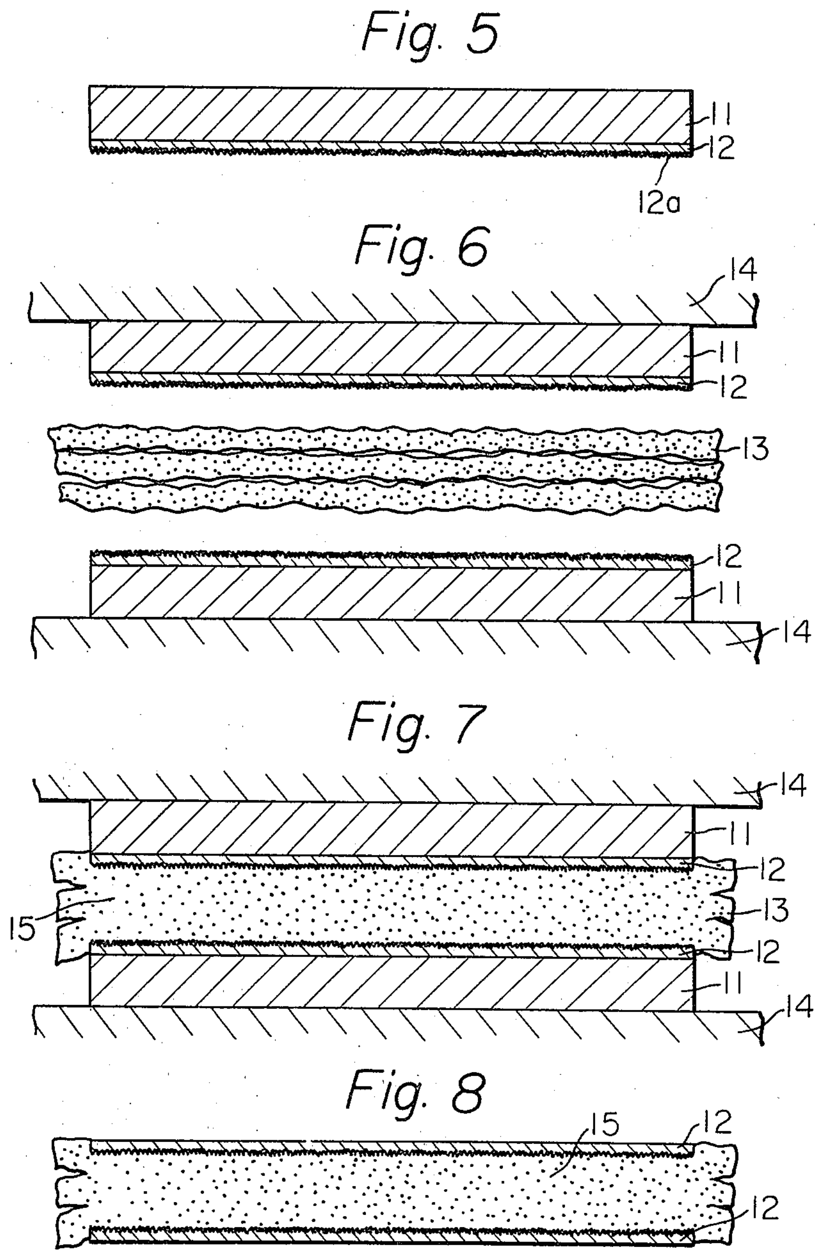
FIG. 5 is a cross-sectional schematic view of a synthetic polymer film having a plated rough surface metal layer.
FIG. 6 is a cross-sectional schematic view of a pair of pressing plates each provided with a synthetic polymer film having a plated rough surface metal layer and three prepregs inserted between the plastic films.
FIG. 7 is a cross-sectional schematic view of three prepregs and a pair of synthetic polymer films each having a plated rough surface metal layer, which are pressed by a pair of pressing plates.
FIG. 8 is a cross-sectional schematic view of a combination of a pressed resinous board and a pair of rough surface metal layers transferred from the synthetic polymer film.

In FIG. 5, a synthetic polymer film 11 which has been activated by the conventional method, is plated with a porous metal layer 12 having a rough surface 12*a*.

Referring to FIG. 6, three prepregs are inserted between a pair of the synthetic polymer films 11 each having a plated rough surface metal layer 12, and the prepregs and synthetic polymer films are inserted between a pair of pressing plates 14.

Referring to FIG. 7, the synthetic polymer films 11 with the plated rough surface metal layers 12 and the prepregs 13 are pressed and heated between a pair of pressing plates 14. The three prepregs are incorporated with each other to form a resinous board 15.

Generally, the bonding force of the metal layer to the synthetic polymer film which has a smooth surface, is smaller than to the resinous board having a rough surface. Therefore, when the pressing plates 14 are separated from the resinous board 15, the metal layer 12 is left on the resinous board 15.

Referring to FIGS. 5 to 7, a metal foil, for example, aluminium or its alloy foil, may be used, as a base material, instead of the synthetic polymer film 11. In this case, after separating the pressing plate 14 from the resinous board 15, the metal foil and the rough surface metal layer plated on the metal foil are incorporated with the resinous board. Accordingly, the metal foil may be removed from the board by dissolving it away with an acid or alkali solution. Also, the plated rough surface metal layer may be removed entirely or partially by dissolving it away with an acid or alkali solution, if desired.

The printed circuit may be formed on the resinous board prepared by the process of the present invention, in any one of the following manners.

First, the plated rough surface metal layer is removed from the resinous board entirely. By this removal, a rough surface corresponding to the rough surface of plated metal layer is formed on the resinous board. A desired circuit is printed on the rough surface of the resinous board.

Second, the plated rough surface metal layer kept on the resinous board is selectively masked with a resist so as to expose a part of the plated rough surface metal layer necessary to form the desired circuit thereon. The exposed portion of the plated rough surface layer is removed by way of etching, whereby the rough surface of the resinous board is selectively exposed in accordance with the pattern of the desired circuit. The exposed rough surface portion is activated by an aqueous solution of $SnCl_2$ or $PdCl_2$ and plated with copper by an electroless plating method, and thereafter, the copper plated conductive portion is further plated with copper by an electrolytic plating method. Thereafter, the masking resist and the masked portion of the plated rough surface metal layer are removed, whereby the desired circuit is formed on the rough surface of the resinous board.

Third, the plated rough surface metal layer on the resinous board is selectively masked with a resist so as to expose a portion thereof corresponding to the desired circuit. The exposed portion of the plated rough surface metal layer is plated with copper by an electroless plating method, and thereafter, the copper plated conductive portion is further plated by an electrolytic plating method, to form the desired circuit. Thereafter, the resist and the masked portion of the plated rough surface metal layer are removed. By this process, the desired circuit composed of the rough surface metal layer, the first plated copper layer and the further plated copper layer, is formed on the rough surface of the resinous board.

In the process of the present invention, the rough surface of the resinous board is formed by transferring thereto the rough surface of the plated rough surface metal layer. The roughness of the surface of the plated rough surface metal layer can be easily controlled by adjusting the plating condition. Accordingly, the roughness of the resinous board surface can be easily controlled. Also, the roughness of the resinous board surface is more uniform than that prepared by the conventional methods wherein reducing agent or metal particles are mixed into resin material.

Even though the surface of the resinous board is made rough, the resinous board of the present invention is not lowered in mechanical, surface and electrical properties thereof.

After completing the electroless plating step, the plated metal layer may be dried at a temperature of about 100°C for about 1 hour in order to enhance the firm fixing of the printed circuit to the resinous board surface.

A preferable embodiment of the process of the present invention will be apparent from the following description.

A preferable plated rough surface zinc layer is formed on an aluminium or its alloy's plate or foil by using an electrolytic plating bath containing zinc oxide and alkali. The base material may be an aluminium or its alloy plate or foil, composite film consisting of a synthetic polymer film and an aluminium or its alloy layer deposited onto the film surface by vacuum evaporation method, or an aluminium or its alloy foil adhered to the film surface with an adhesive.

The zinc rough surface layer can be plated onto the aluminium or its alloy base material surface by an electrolytic plating method using a bath containing zinc oxide and sodium or potassium hydroxide, under a special electrolytic condition.

The aluminium or its alloy and the zinc layer can be easily removed by treating with an acid solution, for example, a hydrochloric acid solution.

The aluminium or its alloy surface to be plated is, if necessary, cleaned to remove fatty substance thereon, and the cleaned surface is plated using a plating bath containing 5 to 90 g/l of zinc oxide and 50 to 450 g/l of sodium or potassium hydroxide. The electrolytic plating may be effected directly on the aluminium or its alloy surface. However, in order to obtain a firm fixing of the zinc layer to the aluminium or its alloy surface, it is preferable that before the electrolytic plating, the aluminium or its alloy is preliminarily plated using the same plating bath as stated above for about 5 seconds to 3 minutes by a chemical substitution plating method.

The electrolytic plating is generally effected at a current density of 0.1 to 0.8 A/dm$^2$ at a quantity of electricity of 6 to 15 A.min/dm$^2$ at room temperature. The above stated condition is suitable to obtain the preferable rough and porous surface.

When the electrolytic plating is effected at a current density of 0.8 to 10 A/dm$^2$ at a quantity of electricity of 15 to 50 A.min/dm$^2$ at room temperature, the resultant rough surface zinc layer is firm and compact. Both the rough porous zinc layer and the rough compact zinc layer have a preferable rough surface.

The plated zinc layer and the aluminium or its alloy base material can be removed by dissolving them away into an aqueous solution of 10 to 20 percent hydrochloric acid. Also, the aluminium or its alloy base may be separated from the plated zinc layer by peeling off, and thereafter, the zinc layer may be removed entirely or partly by the aqueous solution of hydrochloric acid.

The rough surface of the plated zinc layer may be further plated by a metal different from zinc, for example, copper and nickel. In this case, the plated copper or nickel layer has a rough surface corresponding to that of the zinc layer.

The process of the present invention includes various modifications thereof as detailed hereinafter.

The rough surface of the zinc layer plated on the aluminium or its alloy base may be further plated using a plating bath containing a zinc compound other than zinc oxide. This further plating is effective for obtaining a desirable roughness of the rough surface. The plating bath containing zinc oxide and an alkali tends to form very large convexities and concavities on the plated zinc layer surface. Such very large convexities and concavities are not preferable for the purpose of the present invention. That is, they result in very large convexities and concavities on the resinous board surface which convexities and concavities cause a low precision of the patterned circuit and low bonding property to the printed circuit. Therefore, it is desirable that the plated zinc layer surface has convexities and concavities of a height and depth of about 1 to 5 $\mu$. Such preferable rough surface can be obtained by the following process.

An aluminium or its alloy base plated using a plating bath containing zinc oxide and an alkali, is further plated using an acid bath containing a zinc compound selected from zinc sulfate, zinc chloride, zinc borofluoride or zinc sulfamate, a neutral bath containing zinc pyrophosphate, zinc chloride, zinc ammonium chloride or a low concentration of zinc sulfate, or an alkaline bath containing zinc cyanide or triethanolamine chelated zinc.

For example, the plating may be carried out under the conditions as detailed below.

| | | |
|---|---|---|
| 1 | Zinc sulfate bath | |
| | Composition: | |
| | Zinc sulfate ($ZnSO_4$) | 50 – 400 g/l |
| | Ammonium chloride ($NH_4Cl$) | 10 – 40 g/l |
| | Aluminium sulfate ($Al_2(SO_4)_2$) | 20 – 50 g/l |
| | Current density: | 3 – 12 A/dm$^2$ |
| | Quantity of electricity: | 20 – 100 A.min/dm$^2$ |
| | Temperature: | 20 – 40°C |
| 2 | Zinc pyrophosphate bath | |
| | Composition: | |
| | Zinc pyrophosphate ($Zn_2P_2O_7$) | 20 – 300 g/l |
| | Potassium pyrophosphate ($K_4P_2O_7$) | 100 – 300 g/l |
| | Ammonium chloride ($NH_4Cl$) | 50 – 200 g/l |

-Continued

| | |
|---|---|
| Current density: | 2 – 10 A/dm$^2$ |
| Quantity of electricity: | 15 – 100 A.min/dm$^2$ |
| Temperature: | 20 – 40°C |

Generally, the base material plated by the rough surface metal layer is wound, moved, opened or cut into desired size pieces. During such processing, the rough surface metal layer is often broken or damaged. Such defect results in a defect in the resinous board. Particularly, the plated zinc layer has a relatively large tendency to the above-stated defect. In order to protect the plated rough surface metal layer from damage, the rough surface may be coated with a synthetic thermoplastic polymer film. The synthetic thermoplastic polymer usable for the purpose as stated above is selected from polymers having a sufficient amount of the same properties the resinous board, is required to possess, for example, electric properties, thermal stability and chemical stability. The polymer may be selected from the same polymers as those usable for the prepreg, such as phenolic resins, epoxy resins and polyimide, and the same polymers as those usable for adhering the copper foil to resinous board, such as butyrol-modified phenolic resins and epoxy resins. The polymer is dissolved in a solvent, the solution is applied onto the rough surface of the plated metal layer, and the solvent is removed by evaporation. The resin coated rough surface of the plated metal layer is brought into contact with the prepreg, and the plated metal layer is pressed to the prepreg while heating. The coating layer is incorporated with the prepreg and, therefore, a rough surface corresponding to that of the plated rough surface metal layer is formed on the resinous board derived from the prepreg and the coating layer. In this case, the prepreg may be composed of a glass fiber fabric impregnated with a solution of mixture of 50 parts by weight of Epicoat 828, 50 parts by weight of Epicoat 1001, 3 parts by weight of dicyandiamide and 10 parts by weight of diaminodiphenylsulfon in a solvent. The Epicoat 828 and Epicoat 1001 are trade marks of Epoxy resins having epoxy equivalents of 828 and 1001 and made by Shell Chemical Co.

In the process of the present invention, the surface of the base material to be plated may be preliminarily etched to form a rough surface and, thereafter, the etched surface of the base material may be subjected to the plating process by which the plated rough surface metal is formed on the etched surface. This preliminary etching is effective for enhancing the firm fixing of the plated metal surface to the base material surface and obtaining the rough surface of the plated metal layer having suitable roughness. The etching is carried out using a etching solution selected depending upon the kind of the base material to be etched. Aluminium or its alloys are preferably utilized as the base material suitable for the above stated process.

The aluminium or aluminium alloy base can be etched to form the rough surface by the methods detailed below.

1. The aluminium or its alloy base is treated with an aqueous solution of 50 to 200 g/l of sodium hydroxide at a temperature of about 60°C for 10 to 30 seconds. The obtained rough surface has numerous convexities and concavities having a height and depth of 2 to 3 $\mu$ and distributed uniformly on the surface.

2. The etching solution is an aqueous solution of 50 to 200 g/l of sodium hydroxide and 100 g/l of sodium carbonate, and the etching is effected at a temperature of about 60°C for 20 to 60 seconds. The etched surface has numerous convexities and concavities of height and depth of about 2.0 to 2.5 μ distributed uniformly thereon.

3. The etching is effected using an aqueous solution containing 100 g/l of sodium hydroxide, 2 g/l of sodium citrate and 30 g/l of disodium hydrogen phosphate at a temperature of 60°C for 30 to 90 seconds. The etched rough surface has numerous convexities and concavities having a height and depth of about 2 to 3 μ and distributed very uniformly on the surface. The above-mentioned etching solution (3) is effective for preventing crystals of aluminium or its alloy in the base from local chemical dissolving at the intersurfaces of the crystals.

The etched rough surface may be subjected to a smut-removing process using a diluted aqueous solution of nitric acid to remove impurities such as Mg, Si, Mr and Cr in the aluminium or its alloy and to activate the rough surface. The activated rough surface can firmly fix the plated metal layer.

The aluminium or its alloy base may be etched by an electrolytic method.

That is, the electrolytic etching may be effected, for example, by the following method.

| | | |
|---|---|---|
| 1 | Etching solution | |
| | NaOH: | 30 – 60 g/l |
| | Temperature: | 30 – 50°C |
| | Current density at cathod: | 5 – A/dm² |
| | Time: | 1 – 4 minutes |
| 2 | Etching solution | |
| | NaOH: | 30 g/l |
| | NaCl: | 5 g/l |
| | Temperature: | 50°C |
| | Current density at cathod: | 2 – 10 A/dm² |
| | Time: | 30 – 90 seconds |
| 3 | Etching solution | |
| | $H_3PO_4$: | 250 cc/l |
| | $H_2SO_4$: | 200 cc/l |
| | HCl: | 15 cc/l |
| | Temperature: | 30°C |
| | Current density at cathod: | 10 A/dm² |
| | Time: | 30 – 90 seconds |

The rough surface of the base material etched by the above-stated methods, can be plated by the electrolytic or electroless plating method.

The obtained metal layer plated on the base material surface has a preferable rough surface having an excellent fixing ability to the plated circuit.

The following examples are included for a further understanding of the present invention.

EXAMPLE 1

An aluminium foil which has been prepared by a rolling process and has a thickness of 50 μ, was cleaned, to remove fatty substance thereon, with an alkaline aqueous solution containing 50 g/l of sodium silicate and 23 g/l of sodium carbonate at 50°C for 3 minutes, washed with water, treated with an acid aqueous solution of 10 percent nitric acid and then washed with water again. The cleaned aluminium foil was subjected to a chemical substitution plating using an alkaline plating bath containing 60 g/l of zinc oxide and 300 g/l of sodium hydroxide at 22°C for 1 minute. The zinc plated aluminium foil was electrolytically plated by the same plating bath as that stated above at 22°C at a current density of 4 A/dm² for 10 minutes. Thereafter, the zinc plated aluminium foil was washed with water and dried. The resultant rough surface layer had a mean thickness of 5 μ and the rough surface had numerous convexities and concavities, of a height and depth of 5–20 μ, uniformly distributed thereon.

Three pieces of prepregs were provided by impregnating three pieces of glass fiber fabrics with a solution consisting of 125 parts by weight of a mixture of 100 parts by weight of bisphenol A type epoxy resin having an epoxy equivalent of 450 to 500 and 25 parts by weight of novolak type epoxy resin having an epoxy equivalent of 176 to 181, 4 parts by weight of dicyandiamide as a hardening agent, 0.2 parts by weight of benzylmethylamine and 55 parts by weight of methylethylketone as a solvent. The impregnated glass fiber fabrics were half-dried at 120°C for 20 minutes to prepare the prepregs. The three pieces of prepregs were superimposed on each other. The rough surface of the plated zinc layer of the aluminium was brought into contact with a surface of the superimposed prepregs. The aluminium foil and the prepregs were pressed at a pressure of 30 to 40 kg/cm² and simultaneously heated at 160° to 170°C for 1.5 to 2.0 hours. During the pressing and heating, the prepregs were converted into one resinous board. The aluminium foil and the plated rough surface zinc layer were removed by etching with an aqueous solution of 15 percent by weight of hydrochloric acid at 22°C for 30 minutes. The resultant resinous board was washed with water and dried. The rough surface of the resinous board had a desirable roughness.

The resinous board was immersed into a fatty substances-removing liquid and washed with water. The cleaned rough surface of the resinous board was sensitized of treating it with an aqueous solution of 15 g/l of crystalline trinous chloride and 10 cc/l of 32 percent hydrochloric acid solution at 22°C for 5 minutes, and thereafter, washed with water. The sensitized rough surface of the resinous board was activated by treating it with an aqueous solution of 1 g/l of palladium chloride and 10 cc/l of 32 percent hydrochloric acid solution at 22°C for 5 minutes and washed with water. The activated rough surface was plated non-electrolytically by using a plating bath containing 15 g/l of crystalline cupric sulfate, 30 g/l of Rochelle salt, 42 g/l of sodium hydroxide, 20 cc/l of 37 percent formaldehyde solution and 8 g/l of ethylene glycol, at 30°C for 30 minutes, and washed with water. Thereafter, the plated rough surface was further plated electrolytically by using a plating bath containing 85 g/l of cupric pyrophosphate, 310 g/l of potassium pyrophosphate, 3 cc/l of 30 percent ammonia and 0.01 g/l of 2-mercapto-4-methylthiazole, at 55°C at a current density of 3 A/dm² for 70 minutes, washed with water and dried. The plated copper layer was of a thickness of 35 μ. The plated copper layer had a resistance of 1.55 to 1.65 kg/cm to peeling from the rough surface of the resinous board. Such peeling resistance is similar to that of the copper foil of the conventional copper foil coated resinous board.

EXAMPLE 2

The same procedures as in Example 1 were repeated except that the plating of the aluminium foil with zinc was effected by the following method.

Three pieces of aluminium foils were separately primarily plated using an electrolytic plating bath containing 60 g/l of zinc oxide and 300 g/l of sodium hydroxide at 22°C at a current density of 4 A/dm$^2$ for 8, 10 and 12 minutes.

The plated aluminium foils were each divided into three pieces and the two pieces of them were secondarily plated using an electrolytic plating bath containing 30.5 g/l of zinc pyrophosphate, and 300 g/l of potassium pyrophosphate at 22°C at a current density of 2 A/dm$^2$ for 2 and 4 minutes. The plated pieces of the aluminium foil were washed with water and dried, and then the same procedures as in Example 1 were followed.

The resultant copper layer plated on the rough surface of the resinous board had a mean thickness of 35 $\mu$.

The plated copper layers had a resistance to peeling from the rough surfaces of the resinous boards as shown in Table 1.

Table 1

| Resinous board | Item | | | | | | |
|---|---|---|---|---|---|---|---|
| Prepared by using primarily plated rough surface zinc layer | Primary plating time (min) | 8 | | 10 | | 12 | |
| | Resistance to peeling off (kg/cm) | 1.4 | | 1.5 | | 1.6 | |
| Prepared by using primarily and secondarily plated rough surface zinc layer | Secondary plating time (min) | 2 | 4 | 2 | 4 | 2 | 4 |
| | Resistance to peeling off (kg/cm) | 1.6 | 1.8 | 1.6 | 1.9 | 1.9 | 2.0 |

From Table 1, it is clear that the secondary zinc plating on the aluminium foil is effective for enhancing the resistance of the plated copper layer to peeling from the rough surface of the resinous board.

EXAMPLE 3

The same procedures as in Example 1 were repeated except that the rough surface of the plated zinc layer on the aluminium foil was coated with a solution of 125 parts by weight of a mixture of 100 parts by weight of bisphenol A type epoxy resin having an epoxy equivalent of 450 to 500 and 25 parts by weight of novolak type epoxy resin having an epoxy equivalent of 176 to 181, 4 parts by weight of dicyandiamide and 0.2 parts by weight of benzylmethylamine in 55 parts by weight of methylethylketone. The plated copper layer had a resistance to peeling of 1.6 kg/cm.

EXAMPLE 4

The same procedures as in Example 1 were repeated except that the aluminium foil was preliminarily etched with an aqueous solution of 100 g/l of sodium hydroxide, 2 g/l of sodium citrate and 30 g/l of disodium hydrogen phosphate at a temperature of 60°C for 60 seconds to form a rough surface thereof, and treated with a diluted nitric acid aqueous solution to remove smuts.

The plated copper layer on the resinous board had a resistance to peeling of 1.65 kg/cm.

What we claim is:

1. A process of producing a rigid resinous board having a rough surface effective for firmly supporting thereon a printed circuit, comprising providing a rough surface metal layer of Sn, Pb, or Zn formed on a base material by way of an electrolytic plating method using an aqueous solution containing at least one compound selected from the group consisting of Sn $(BF_4)_2$, Pb $(BF_4)_2$, $K_2SnO_2$, $ZnSO_4$, $ZnO$, $Zn_2P_2O_7$, $SnCl_2$, $ZnCl_2$, $Zn(CN)_2$, and $SnSO_4$;

superimposing at least one prepreg consisting of at least one insulating fibrous substrate impregnated with an insulating synthetic resin liquid half-dried, on the rough surface metal layer of the base material;

pressing and heating the superimposed prepeg and base material to convert the prepeg to a rigid resinous board; and removing the base material entirely and at least a part of the plated rough surface metal layer from the rigid resinous board, whereby the rough surface pattern of the plated rough surface metal layer is transferred to the surface of the rigid resinous board.

2. A process as claimed in claim 1, wherein the base material consists of a metallic material or a thermoplastic synthetic polymer.

3. A process as claimed in claim 2, wherein the metallic base material is selected from aluminium, nickel, steel, and alloys containing one or more of the above-mentioned metals.

4. A process as claimed in claim 2, wherein the metallic base material has a thickness of 20 to 100 $\mu$.

5. A process as claimed in claim 4, wherein the thickness of the metallic base material is 40 to 60 $\mu$.

6. A process as claimed in claim 2, wherein the base material is an aluminium foil having a thickness of 40 to 60 $\mu$.

7. A process as claimed in claim 2, wherein the polymer base material is selected from polyethylene terephthalate and cellulose acetate.

8. A process as claimed in claim 1, wherein the plated rough surface metal layer consists of a metal selected from the group consisting of lead, tin, zinc, copper, nickel, cobalt and alloys containing one or more of the above-mentioned metals.

9. A process as claimed in claim 1, wherein said fibrous substrate of the prepreg is selected from the group consisting of glass and synthetic fiber webs and fabrics, and paper.

10. A process as claimed in claim 1, wherein said insulating synthetic polymer is selected from the group consisting of unsaturated polyesters, polyimides, epoxy resins, phenolic resins and polybisdien.

11. A process as claimed in claim 1, wherein the pressing of the superposed prepreg and base material is carried out under a pressure of 5–80 $kg/cm^2$.

12. A process as claimed in claim 1, wherein the heating of the superposed prepreg and base material is effected at a temperature of 130°–250°C.

13. A process as claimed in claim 1, wherein the removal of the base material and at least a part of the rough surface metal layer is effected by dissolving them away with an acid or alkali.

14. A process as claimed in claim 1, wherein the removal of the base material and at least a part of the rough surface metal layer is effected by peeling them off the rigid resinous board.

15. A process as claimed in claim 1, wherein the removal of the base material and at least a part of the rough surface metal layer is effected by peeling off the base material from the rough surface metal layer bonded with the rigid resinous board, and thereafter, dissolving away at least a part of the rough surface layer from the rigid resinous board.

16. A process as claimed in claim 1, wherein the rough surface metal layer is formed by two different plating steps.

17. A process as claimed in claim 16, wherein a first plating is effected using an alkaline plating bath containing zinc oxide and a second plating is effected using a plating bath containing a zinc compound other than the zinc oxide.

18. A process as claimed in claim 1, wherein the base material has a rough surface formed previously thereon.

19. A process as claimed in claim 1, wherein the rough surface metal layer is coated with a resinous material layer prior to the superimposing.

20. A process as claimed in claim 19, wherein the resinous material is selected from the group consisting of phenolic resins, epoxy resins, polyimide resins, butyrol-modified phenolic resins and unsaturated polyester resins.

* * * * *